United States Patent [19]

Descamps et al.

[11] 4,306,006
[45] Dec. 15, 1981

[54] METHOD OF DIRECTLY MANUFACTURING RETICLE PATTERNS ON CHROME-COATED PLATES BY MEANS OF A PATTERN GENERATOR

[75] Inventors: Denis Descamps, Ponthierry; Daniel Guermont, Athis-Mons; Zbigniew Paczinski, Mennecy; Jacques Sautereau, Soisy-sous-Seine, all of France

[73] Assignee: International Business Machines Corporation, Armonk, N.Y.

[21] Appl. No.: 161,818

[22] Filed: Jun. 23, 1980

[30] Foreign Application Priority Data

Jun. 29, 1979 [FR] France ............................ 79 17304

[51] Int. Cl.$^3$ .......................... G03C 5/00; H05K 3/06
[52] U.S. Cl. ...................................... 430/5; 430/275; 430/313; 430/314; 430/318; 156/318
[58] Field of Search .................. 430/5, 275, 313, 314, 430/318; 156/643

[56] References Cited

U.S. PATENT DOCUMENTS 3,877,810  4/1975  Feldstein ................................. 430/5
3,923,568  12/1975  Bersin .................................. 156/643
3,986,876  10/1976  Abita .................................... 430/5
4,092,442  5/1978  Agnihotri et al. .................. 156/643

OTHER PUBLICATIONS

An Introduction to Photofabrication using Kodak Photoresists, Kodak Publication P-79, 1966, pp. 20 and 21.
Proceedings of the Second Seminar on Microminiaturization, Apr. 4 and 5, 1966 by G. F. Damon, pp. 36-43.

*Primary Examiner*—Jack P. Brammer
*Attorney, Agent, or Firm*—Graham S. Jones, II

[57] ABSTRACT

Reticle patterns are formed upon a chrome-coated plate by means of forming a resist pattern upon the surface of the chrome having a predetermined thickness at which resonant absorption phenomenon occurs and a maximum rate of development is achieved. The resist layer should comply with the relationship $$e = \frac{\lambda}{4n}(2K + 1)$$

where $\lambda$ is representative of the chosen wavelength of the light source used to expose the resist, n is representative of the index of refraction of the resist for that chosen wavelength, and k is an integer ranging from 0 to 4. Resists with such thicknesses establish stationary wave phenomena in order to permit use of very thin resist layers. The value of k should preferably be one, for a resist thickness of about 1800 Å where n equals 1.63 and $\lambda$ is about 4050 Å for xenon lamps. The resist is then exposed by a pattern generator, developed, and a positive or negative pattern is formed by means of etching or a lift-off technique, respectively.

8 Claims, 13 Drawing Figures

FIG. 4.1
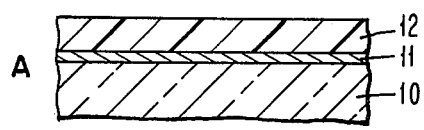
FIG. 5.1
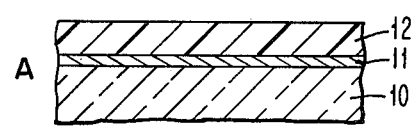
FIG. 4.2
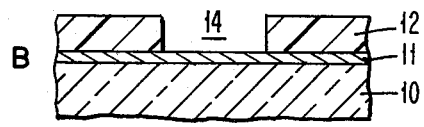
FIG. 5.2
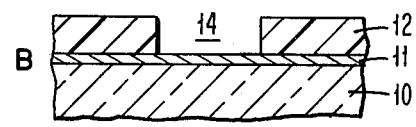
FIG. 4.3
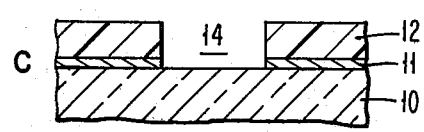
FIG. 5.3
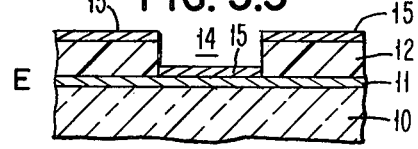
FIG. 4.4
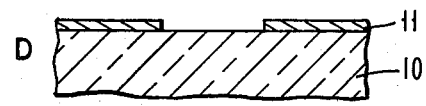
FIG. 5.4
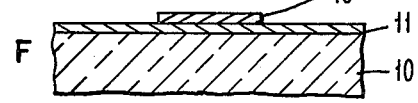
FIG. 5.5
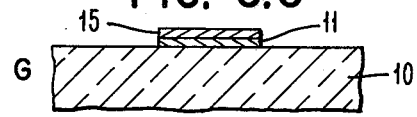
FIG. 5.6

METHOD OF DIRECTLY MANUFACTURING RETICLE PATTERNS ON CHROME-COATED PLATES BY MEANS OF A PATTERN GENERATOR

DESCRIPTION

1. Technical Field

This invention relates to a method of directly manufacturing masks composed of reticle patterns on chrome-coated plates by means of a pattern generator without using an emulsion plate. More particularly, it relates to a method of depositing an ultra-thin photoresist layer upon a glass plate coated with a chrome layer and a special illumination system adapted to use with a pattern generator to produce reticle patterns upon direct exposure of the plate. This invention relates to both a direct process and a reversal process for making reticle patterns with reversed contrast.

2. State of the Art

Masks are essential tools in the manufacturing of Large Scale Integrated (LSI) circuits. Such masks are obtained from reticle patterns or segments (10×X: a unitary cell magnified ten times) formed either on a gelatin photosensitive plate (emulsion process) or on a chrome plate. Gelatin plates are very fragile and have a short lifetime. Chrome plates are more advantageous in that they have longer lifetimes, sharper black/white transitions, etc., and, therefore, are widely used.

A conventional method of manufacturing the reticle patterns consists in exposing a photosensitive plate (a glass plate coated with an emulsion layer) to Xenon flash lamp rays by means of a pattern generator. Then, the plate is developed and fixed by using a conventional photographic process. The photosensitive plate is not directly usable in photoreduction- and repetition-mask manufacturing in view of the number of the defects inherent in photosensitive plates which would be reproduced in all the cells of the mask. Therefore, it is necessary to transfer this pattern to a chrome-coated glass plate on which it is easier to repair the defects by means of a conventional laser or chemical etching techniques. Such a transfer operation is carried out by standard contact printing techniques and exposure to a mercury arc lamp. Such a process is summarized in FIG. 1.

The drawbacks of the conventional process are as follows:

1. Bad quality of the emulsion plates which makes it necessary to repair the defects on the chrome layer (long and expensive operation).

2. Unpredictable distortion of the pattern during contact printing operation. Such a distortion is characterized by a variation in the chip size on the order of ±2 μm, which may lower the yield of the semiconductor manufacturing because the misalignment of the patterns.

3. Unpredictable distortion of the pattern size in connection with the contact printing operation. Such variations on the order of a ±1 μm demand corrections in regard to the exposure time during the manufacturing of the final mask.

4. The process is relatively a long one, about 4 hours 30 minutes for the reversal process and about 4 hours 15 minutes for the regular process.

SUMMARY OF THE INVENTION

Therefore, the prior art process has many drawbacks. A particular drawback is that it requires preparation and processing of the emulsion plate and then transfer of the pattern thereof onto the chrome plate.

A first object of this invention is to discard the "emulsion" plates and the process relative thereto and instead to use a new process capable of directly generating "positive" and "negative" reticle patterns upon chrome-coated plates by means of a pattern generator, having both economical (time saving, ...) and technical (improved definition of the patterns) advantages.

A further object of this invention is to provide a reticle pattern manufacturing process in which an ultra-thin resonant resist layer is coated on the chrome plate, giving higher precision than that obtained with thicker resist layers.

Another object of this invention is to modify the pattern generating equipment so that it can expose such ultra-thin photosensitive resists.

Still another object of this invention is to provide a plasma-type etching process to improve the definition of the patterns further.

Therefore, a process in accordance with this invention is to manufacture reticle patterns on a substrate. The substrate is made from a transparent plate coated with an opaque layer. The process is characterized by the following steps:

1. Deposit an ultra-thin sensitive resist upon the substrate. The resist is of such a thickness as to correspond to the thinnest resonant resist which allows etching without defects (such as pin holes) according to the relationship:

$$e = 3\lambda/4n$$

where n is the resist index for the chosen wavelength (λ), and prebake the resist according to the conventional technique.

2. Expose the substrate processed in accordance with (1) above to radiation from a pattern generator according to the desired configuration, and then develop the resist and remove the undesired portions of the resist in accordance with the desired pattern to yield apertures in the resist.

3. Plasma-etch the opaque layer through the so-created apertures in the developed resist layer.

4. Remove the remainder of the resist, whereby a desired reticle pattern composed of fragments of the opaque layer remains.

In the preferred embodiment of this invention, the substrate is a chrome-coated glass plate, the utilized resist is the positive photoresist AZ 1350J of the Shipley Company, the radiation source is a high energy Xenon flash lamp, and the chosen thickness is 1800 Å.

Further in accordance with the method of this invention is to manufacture a reticle pattern having a reversed contrast with respect to the previous one. The substrate comprises a transparent plate coated with an opaque layer. The method is characterized in that it includes the following steps:

1. Deposit an ultra-thin photosensitive resist layer upon the substrate to a thickness corresponding to the thinnest resonant resist which allows etching without defects, according to the relationship $$e = 3\lambda/4n$$

where n is the resist index for the chosen wavelength (λ), and prebake the resist according to the conventional technique.

2. Expose the substrate as processed in accordance with (1) above to radiation from a pattern generator according to the desired configuration and then develop the resist and remove the undesired portions of the resist in accordance with the desired configuration to yield apertures in the resist.

3. Deposit a metal layer upon the structure.

4. Remove the portion of the metal coating resting directly upon the remainder of the resist by means of the lift-off technique.

5. Etch the opaque layer through the apertures made in the remaining portions of the metal layer which produces a reversed contrast reticle pattern.

The foregoing and other objects, features and advantages of the invention will be apparent from the following more particular description of a preferred embodiment of the invention, as illustrated in the accompanying drawings.

BRIEF DESCRIPTION OF THE DRAWINGS

FIGS. 4.1–4.4 and 5.1–5.6, respectively, illustrate the detailed steps of manufacturing reticle patterns on chrome coated plates according to the direct and reversal techniques.

DESCRIPTION OF THE INVENTION

Figure 1:
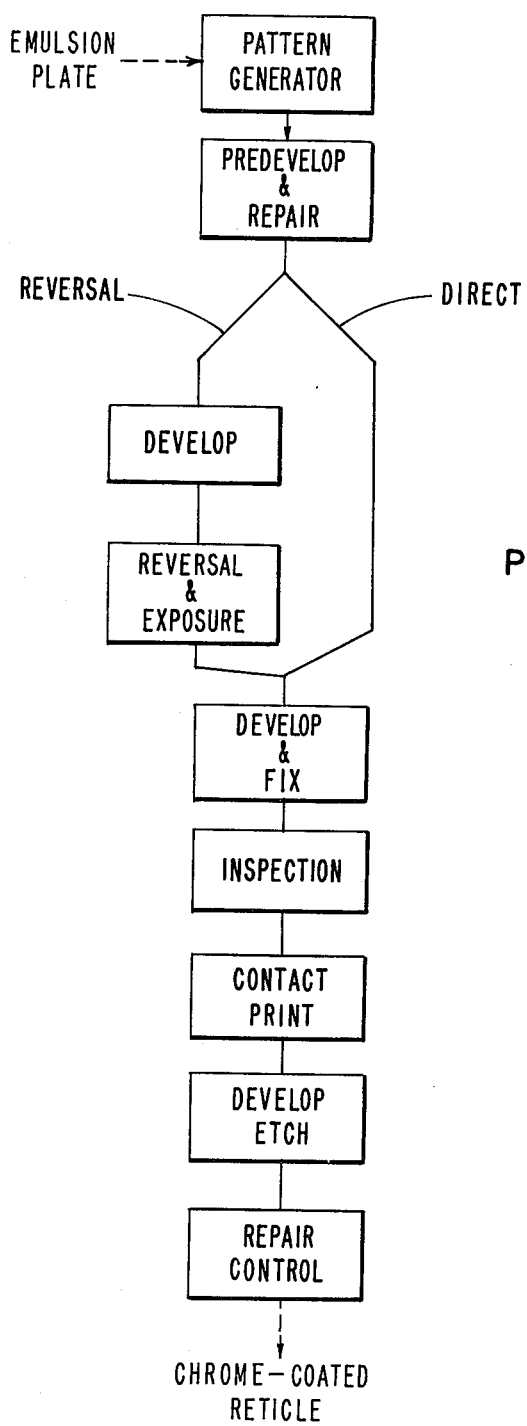
FIG. 1 is a schematic diagram of the conventional (prior art) reticle pattern manufacturing process (both direct and reversal techniques) in a plate coated with a photosensitive emulsion.

FIG. 1 shows the conventional prior art method of manufacturing chrome plates for use as reticle patterns. The details and drawbacks of this method have been described above. From the preceding description, it is obvious that the direct generation of reticle patterns is highly desirable. Various approaches have been envisaged.

The standard Xenon flash lamp arranged on the pattern generating equipment is replaced by a mercury arc lamp provided with a shutter, making use of photosensitive resist-chrome-coated glass plates. A mercury arc lamp with a power of from 500 to 1000 times as great as the Xenon lamp is required to expose thick photosensitive resist layers which have very slow exposure rates compared with the photosensitive emulsions (a ratio of 400:1). The prior art process which could be advantageously used with standard chrome plates is extremely slow, thereby yielding a low manufacturing throughput. Accordingly, it is of little interest to industry.

Another solution consists of making use of chrome plates coated with a commercially available emulsion layer. Such a process has an advantage of not necessitating alterations in the pattern generator. On the other hand, such plates are costly, and the quality of the reticle patterns produced is poor.

Another solution, which is the preferred one, consists in eliminating the emulsion process completely while keeping the same throughput, making use of an ultra-thin photosensitive resonant resist layer and making minor modifications in the pattern generator and in the reticle pattern manufacturing process, as well.

PREFERRED EMBODIMENT OF THE INVENTION

Therefore, this invention necessitates alterations in the illumination system of the pattern generator (1) in order to increase its light intensity, and a new manufacturing process (2) based on the use of an ultra-thin photosensitive resonant resist layer, and a plasma etching step for the manufacture of the reticle patterns.

(1) Illumination System

A standard illumination system for generating patterns upon an emulsion layer is comprised of a typical 20W, 1 Joule per flash, Xenon flash lamp. Such power is not sufficient to expose the standard resists at usual thicknesses (5000–15000 Å such as the AZ 1350J resist) which are far less sensitive than the photosensitive emulsions (the ratio being about 400:1). The illumination system of this invention aims at using the maximum energy available within the state of the art. First, it has increased electrical power producing 6.7 Joules per flash at a maximum rate of 50 flashes per second. Then it has a more powerful flash lamp. The maximum energy per flash, however, is limited by the average energy which can be obtained with Xenon flash lamps and by the time length of the flash, as well (in the case of flashing "on the fly"). The commercially available FX 193 type Xenon flash lamps (100 watts) or the FX 193 U type Xenon flash lamps manufactured by the EG & G firm are recommended. Such alterations can be easily made in the commercially available pattern generators, such as Mann 3000-type pattern generators. It is also important to operate with no filter between the lamp and the photosensitive plate, the resist itself acting as a filter.

Other illumination systems, such as electron beams or X-rays, could also be applied.

(2) Manufacturing Process

The energy produced by the above-described system, however, does not make it possible to use the well known processes in view of their low photosensitivity. The process utilized in this invention can be satisfactory only when very thin resist layers are utilized. This specific point has been theoretically studied and has lead to a determination of the thicknesses at which a stationary wave phenomenon would occur. That would make it possible to use the throughput of the incident radiations (resonance), at best. The study of this multiple wave interference phenomenon, indeed, gives the user a series of resist thicknesses at which this resonance phenomenon occurs.

Figure 2:
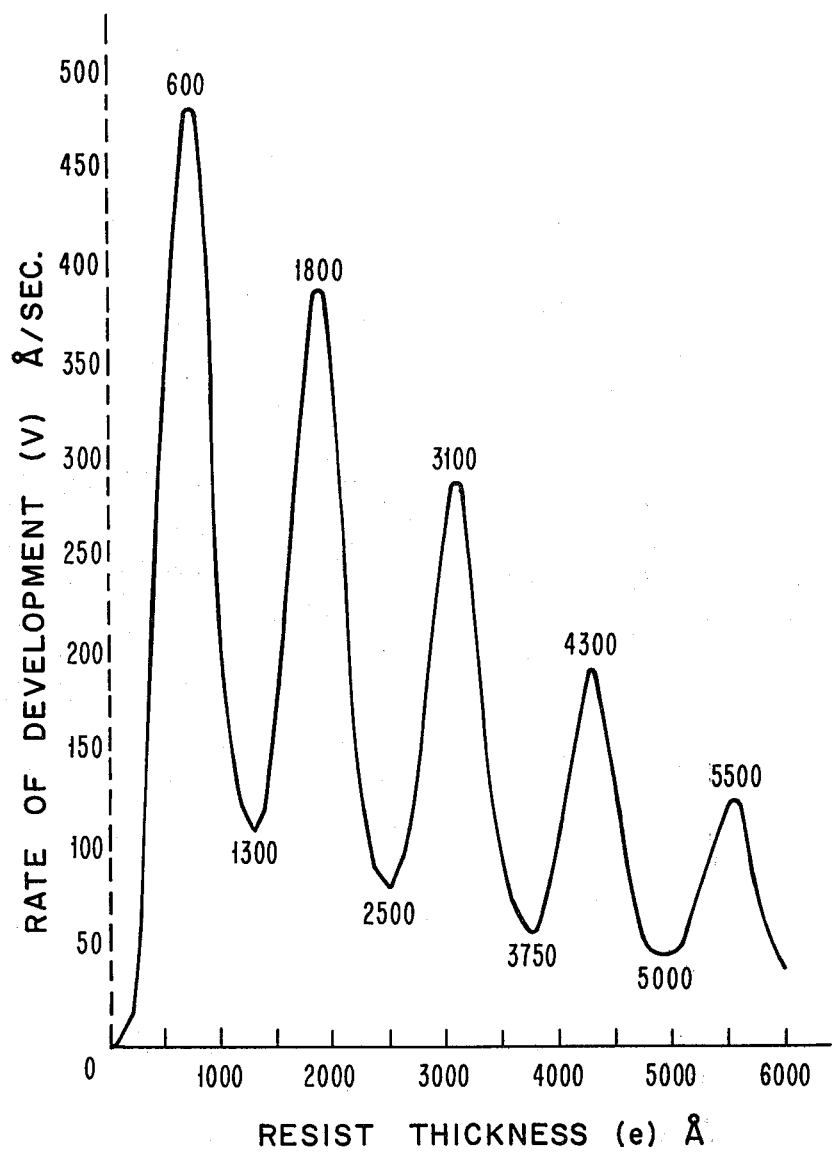
FIG. 2 illustrates the curve of the rate of development of a typical photosensitive resist in (Å/sec) versus the resist thickness e (in Å) for a given wavelength and for a given type of the substrate (glass plate coated with chrome with a reflectivity of 45%).

The development rate is maximum when the thickness is the smallest, when a resonant absorption phenomenon occurs, when the substrate reflectivity (such as for instance, a chrome-coated plate) is high, and when the utilized resist is photosensitive. The result of these calculations for conventional resist AZ 1350 J is shown in FIG. 2. FIG. 2 also illustrates the rate of development in Å/sec versus the resist thickness (e) in Å, for a given exposure wavelength ($\lambda = 4050$ Å for Xenon lamps). Such a curve is also valid for a great number of commercially available resists.

It can be appreciated that, for thin resist layers, two thicknesses are of particular interest, namely, $e = 600$ Å and $e = 1800$ Å. The first layer is difficult to use because it is too thin and, therefore, has defects (such as pin holes after development), which entail other defects in the mask. The 1800 Å thick layer appears to be optimum compared with the other resonant thicknesses, namely 3100 Å, 4300, . . ., that can be used. In view of the curved shapes of the peaks, these thicknesses are approximate. More generally, after computation of the stationary waves in the thin layers, the chosen layers should comply with the relationship.

$$e = \frac{\lambda}{4n}(2k + 1)$$

where
k=0 corresponds to a 600 Å layer and
k=1 corresponds to a 1800 Å layer
wherein λ is representative of the chosen wavelength, and n is representative of the index of refraction of the resist for this wavelength (for resist AZ 1350 J, the approximate value of n is 1.63).

Figure 3:
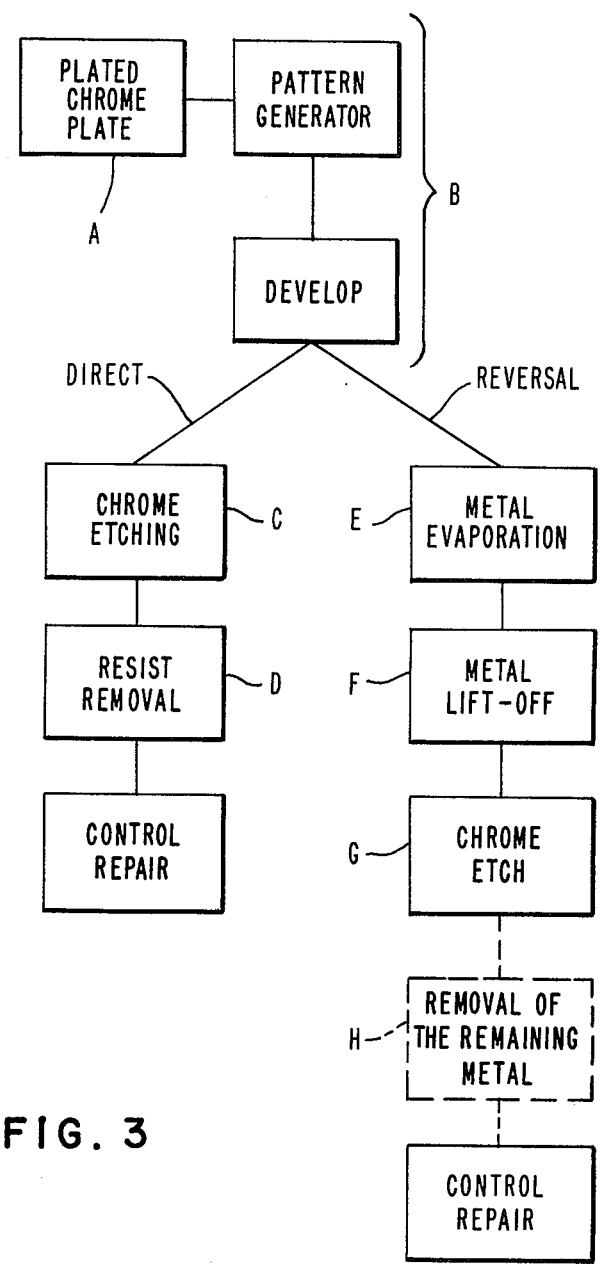
FIG. 3 is a schematic diagram of the reticle pattern manufacturing process (both direct and reversal techniques) of this invention as adapted for chrome-coated plates.

This process is disclosed below in detail with reference to FIG. 3 which shows the various manufacturing steps of the process schematically (both direct and reversal techniques). FIGS. 4.1–4.4 and 5.1–5.6 illustrate the evolution of the substrate through the direct and reversal techniques, respectively. The corresponding steps in FIGS. 4 and 5 use the same reference numbers and corresponding steps are indicated by letters. Step A corresponds to the preparation of the substrates 10 which are transparent plates coated with an opaque layer 11. Preferably, substrates 10 are formed of high reflectivity (R=60%) plates coated with a chrome layer 11, such as those manufactured by Hoya. Other metals, such as iron oxide, gold or aluminum could be utilized instead of chrome. The chrome-coated plates 10, 11 are coated with an ultra-thin resonant resist layer 12, and then they are introduced into a conventional pattern generator, such as, for instance, a Mann 3000-type generator, modified as mentioned above, in order to produce sufficient light intensity. The utilized photosensitive resist is AZ 1350 J manufactured by Shipley & Co. Other types of resists could be utilized. The thin resist layers are obtained upon dilution of resin AZ 1350 J with thinner resist AZ (which is also manufactured by Shipley) in proportion 25/75 by weight. Before exposure, the substrates are prebaked in a conventional way at 85° C. for 30 minutes. After exposure in step B (FIGS. 4.2 and 5.2), the substrates are developed in order to eliminate the exposed portions producing openings 14. The developer can be developer AZ manufactured by Shipley, which is associated with a wetting agent, such as agent FC 126 (0.5%) for the above-mentioned type of resist. The development time is about one minute. A mixture of trisodium phosphate and sodium metasilicate can also be used. The thickness of the resist, after development, is 1200 Å. In the direct technique in FIG. 4.2 during step C in FIG. 4.3 of forming negative-type reticle patterns, the substrates 10 are subjected to chrome etching through the apertures 14 in the resist masking layer 12. In order to obtain high precision in the definition of the reticle pattern in step C of FIG. 3 and FIG. 4.3, it is important to make use of a plasma-etching (dry etch technique) for four minutes in LFE 501-type equipment, for instance. The presence of resist layer 12 prevents wet etching techniques from being used, which make a significant quantity of unwanted holes in the chrome layer 11. The remaining resist layer 12 is finally removed by means of a conventional process during step 4 (FIG. 4.4), such as, for instance, through plasma-stripping for 10 minutes. The substrate, when etched according to the required pattern is transformed into the desired reticle pattern after steps of control and possibly a repair step in FIG. 3 after step 4.

In the reversal process of FIGS. 5.1–5.6 during step E (FIG. 5.3), metal layer 15 is deposited upon the substrate 10. For instance, a 400 Å thick aluminum layer or a 100 Å platinum layer 15 is evaporated or cathode-sputter deposited. Other metals such as gold and copper can be used in layer 15. During the lift-off step F (FIG. 5.4) the resist 12 is removed when soaked in an ultrasonic bath of N-methyl pyrrolidone, ethyl acetate, or in a mixture of nitric, chromic and sulphuric acids. The metal layer 15 which is coated on the resist is then removed by a lift-off technique.

When the metal utilized is a cathode-sputter-deposited platinum 15, the photoresist 12 should be removed by an oxygen plasma or by an oxygen-helium plasma applied for about 10 minutes when one to five such plates are present in the plasma. In that case, the photoresist 12 is removed by lift-off but the platinum 15 remains on the chrome 11 in the pulverulent state, which should be removed through a pressurized water jet or rubbing in water with a plastic scrubber thereby obtaining the platinum layer 15 deposited in the openings made in the resist.

The platinum deposit 15 and the plasma-stripping of the resist 12 make it possible to obtain better definition of the images and a better reproducibility of the process as well.

The nonprotected chrome layer 11 is then plasma-etched, or removed, through wet etching in step G (FIG. 5.5). Optionally, during step H (FIG. 5.6) an aluminum layer 15 can be etched when soaked in caustic soda, or else, this layer can be left as an additional protective layer. After control and repair, the reticle pattern is ready for use on the manufacturing lines. The implementation of this process is simple and makes it possible to obtain reversed contrast patterns with no alteration in both quality and size. This process can apply to the generation of integrated circuit patterns when the latter are directly generated upon a chrome-plated plate. Such a process is of interest in the manufacturing of reticle patterns (10×X) which are directly exposed by a pattern generator (or by means of electron beam equipment), or possibly, of masks (1X) by means of electron beams or X-ray equipment.

This invention offers several advantages.

Economic Advantages

The emulsion procedure is eliminated, which reduces the material costs (the equipment involved in this process is less cumbersome) and processing time and money.

Technical Advantages

With this invention, it is possible to manufacture reticle patterns of better quality since several intermediate steps are bypassed, such as the emulsion procedure and contact printing for making a reticle pattern. The last advantage implies the following parameters:

1. Pattern Definition: Since contact printing is removed, the pattern definition is improved, i.e., the angles are sharper and the edges are straight-lined.

2. Reproducibility: For both pattern and chip sizes, the advantage of reproducibility is connected to bypassing the intermediate operations, namely, the emulsion procedure and contact printing.

The improvements, therefore, entail a reduction of the dispersion of the results in the order of 1 μm and 2 μm with respect to the patterns and chips, respectively.

Industrial Advantages

With this invention, it is easy to modify existing pattern generators by changing the electrical power and the flash lamp to make it possible to manufacture reticle patterns for a low investment with regard to the cost of the equipment, proper. The above-described modified equipment has a pattern generation rate which is not changed with respect to the emulsion procedure.

Such a printing rate is about 10 images per second and may depend on the type of equipment considered.

While this invention has been particularly shown and described with reference to a preferred embodiment thereof, it will be understood by those skilled in the art that numerous changes in form and detail may be made therein without departing from the spirit and scope of the invention.

Having thus described our invention, what we claim as new and desire to secure by Letters Patent is:

1. A process for manufacturing patterns on a substrate, said substrate comprising a transparent plate coated with an opaque layer, said process including the following steps:
   depositing an ultra-thin sensitive resist upon said substrate, said resist being of a thickness which corresponds to the thinnest resonant resist which allows etching without defects according to the relationship $$e = 3\lambda/4n$$

where e is the thickness of said resist in Angstoms, and n is the resist index of refraction for the chosen resist exposure wavelength (λ) in Angstroms,
   prebaking said resist,
   exposing said substrate processed in accordance with the above to radiation consisting of said chosen wavelength λ from a pattern generator in a predetermined desired configuration, and then developing said resist and removing any undesired portion of said resist in accordance with said pattern to yield an aperture pattern in said resist,
   plasma-etching said opaque layer through said aperture pattern in said developed resist layer, and
   removing the remainder of said resist, whereby a pattern with the desired configuration composed of a fragmented pattern of said opaque layer remains.

2. A process for manufacturing a pattern on a substrate, said substrate comprising a transparent plate coated with an opaque layer, said process including the following steps:
   depositing an ultra-thin photosensitive resist layer upon said substrate, said resist being of a thickness which corresponds to the thinnest resonant resist which allows etching without defects according to the relationship $$e = \frac{[3]\lambda}{4n}(2k + 1)$$

where e is the thickness of said resist in Angstroms, n is the resist index of refraction for the chosen wavelength (λ) in Angstroms, and k is an integer within the range 0 to 4,
   prebaking said resist,
   exposing said substrate processed in accordance with the above to radiation consisting of said chosen wavelength λ from a pattern generator in a predetermined desired configuration and then developing said resist and removing any undesired portion of said resist in accordance with said configuration to yield an aperture pattern in said resist,
   depositing a metal layer upon the structure,
   removing the portion of said metal coating resting upon the remainder of said resist by means of a lift-off step,
   etching said opaque layer through said aperture pattern made in the remaining portions of said metal layer, whereby a reversed contrast pattern remains with the desired configuration of fragments of said opaque layer remaining.

3. A process for manufacturing a pattern on a substrate, said process including the following steps:
   depositing a resist upon said substrate according to the relationship $$e = \frac{\lambda}{4N}(2k + 1)$$

where e is the thickness of said resist in Angstroms, n is the resist index of refraction for the chosen resist exposure wavelength (λ), and k is an integer within the range 0 to 4,
   prebaking said resist,
   exposing said substrate processed in accordance with the above to radiation consisting of said chosen wavelength λ from a source of a pattern in a desired configuration,
   and then developing said resist and removing the undesired portions of said resist in accordance with said pattern to yield an aperture pattern in said resist.

4. A manufacturing process according to claim 2, characterized in that it further includes the step of removing the remaining portions of said metal layer.

5. A manufacturing process according to claim 4, characterized in that said metal comprises aluminum on the order of 400 Å thickness.

6. A manufacturing process according to claim 1, 2, 3, 4 or 5, characterized in that said opaque layer comprises a high reflectivity chrome-coated plate.

7. A manufacturing process according to claim 1, 2, 3, 4 or 5, characterized in that the resist is a positive-type resist diluted with a thinner in the proportion 25/75 by weight.

8. A manufacturing process according to claim 1, 2, 3, 4 or 5, characterized in that the radiation is produced by a high intensity Xenon flash lamp and that the resist is a positive-type resist diluted with a thinner in the proportion 25/75 by weight and is 1800 Å thick (k=1).

* * * * *

UNITED STATES PATENT AND TRADEMARK OFFICE
CERTIFICATE OF CORRECTION

PATENT NO. : 4,306,006
DATED : December 15, 1981
INVENTOR(S) : D. Descamps, D. Guermont, Z. Piaczinski, J. Sautereau It is certified that error appears in the above—identified patent and that said Letters Patent is hereby corrected as shown below:

On the title page, Item [75]
Inventors: change " Zbigniew Paczinski" to read --Zbigniew Piaczinski--

Signed and Sealed this

Twenty-ninth Day of June 1982

[SEAL]

Attest:

GERALD J. MOSSINGHOFF

Attesting Officer      Commissioner of Patents and Trademarks